(12) United States Patent
Pei et al.

(10) Patent No.: US 6,169,656 B1
(45) Date of Patent: Jan. 2, 2001

(54) FAN DUCT FOR DISSIPATING HEAT OF A CPU OF A COMPUTER

(75) Inventors: Hsien-Shen Pei, Taipei; Eric Sun, Kee-Lung; Richard Lee, Taipei, all of (TW)

(73) Assignee: Foxconn Precision Components Co., Ltd., Taipei Hsien (TW)

(*) Notice: Under 35 U.S.C. 154(b), the term of this patent shall be extended for 0 days.

(21) Appl. No.: 09/346,177

(22) Filed: Jul. 1, 1999

(30) Foreign Application Priority Data

Jul. 9, 1998 (TW) .................................... 87211070

(51) Int. Cl.⁷ ...................................................... H05K 7/20
(52) U.S. Cl. .......................... 361/695; 312/236; 361/809; 454/184
(58) Field of Search .................. 454/184; 312/223.2, 312/236; 165/80.3, 121–126; 248/317; 361/687, 690, 694, 695, 807, 809, 810, 608–610, 725, 727

(56) References Cited

U.S. PATENT DOCUMENTS

| | | |
|---|---|---|
| 4,498,123 * | 2/1985 | Fuss . |
| 5,703,751 * | 12/1997 | Huang . |
| 5,788,566 * | 8/1998 | McAnally . |
| 5,871,396 * | 2/1999 | Shen . |
| 5,986,883 * | 11/1999 | Johnson . |
| 6,002,586 * | 12/1999 | Chen . |

* cited by examiner

Primary Examiner—Gerald Tolin
(74) Attorney, Agent, or Firm—Wei Te Chung

(57) ABSTRACT

A fan duct for dissipating heat generated by a central processing unit of a computer is disclosed. The fan duct has a main body defining an air inlet and an air outlet. An electrical fan is mounted to the main body below the air outlet. A knob is attached to a top wall of the main body and located above the fan. An enclosure of the computer includes a back panel and a top cover. The top cover is attached with a hook. The fan duct is firstly assembled to the back panel by extending screws through the back panel to threadedly engage with the fan duct. The top cover is then mounted to the back panel to reach a finally assembled position in which the hook engages with the knob, whereby a portion of a weight of the fan is supported by the hook.

9 Claims, 6 Drawing Sheets

FAN DUCT FOR DISSIPATING HEAT OF A CPU OF A COMPUTER

BACKGROUND OF THE INVENTION

FIELD OF THE INVENTION

The present invention is related to a fan duct for dissipating heat of a central processing unit (CPU) of a computer, and particularly to a fan duct which can be conveniently and reliably mounted within a computer.

As the processing speed of the CPU increases, heat generated by the CPU increases accordingly. The heat needs to be timely dissipated; otherwise, a malfunction or unstableness of the computer will happen. A fan duct is proposed to dissipate the heat generated by the CPU. The fan duct is mounted in the computer with an air inlet connected to a surrounding environment of the computer, and an air outlet facing the CPU. The fan duct is equipped with an electrical fan located below the air outlet, whereby when the fan is activated, cool air is suck into the fan duct via the inlet and directed to the CPU via the outlet, thereby keeping the temperature of the CPU within a permitted range. Related prior art can be referred to Taiwan Patent Application Nos. 84104469 and 86205661.

Referring to FIGS. 5 and 6, a conventional fan duct 9 is shown. The fan duct 9 is fixed to a back panel 97 of an enclosure 96 of a computer. The fan duct 9 includes a hollow, elongated main body 90 and an electrical fan 99. The main body 90 is formed by plastic injection molding. The main body 90 has a bottom wall 92 and a side wall 91. The bottom wall 92 defines an air outlet 94. The side wall 91 defines a number of pinholes functioning as an air inlet 93. Mounting posts 95 with screw holes 951 are set at four corners of the side wall 91. The mounting posts 95 are used for mounting the main body 90 on the back panel 97 by extending four screws 971 through the back panel 97 to threadedly engage with the screw holes 951, The fan 99 is mounted on the bottom wall 92 below the air outlet 94. When the fan 99 is activated, as indicated by arrows of FIG. 6, cool air outside the enclosure 96 is driven to flow into the main body 92 via the inlet 93 and directed to a CPU (not shown) located just below the outlet 94. Since the fan duct 9 is relatively long and the fan 99 is mounted at a point distal from the fixing point formed by the screws 971, a large bending moment caused by a weight of the fan 99 is totally exerted to the screws 971, whereby after a period of operation of the fan duct 9, the connection between the screws 971 and the mounting posts 95 may become loosen, causing the fan duct 9 to function improperly.

Hence, an improved fan duct is needed to eliminate the above mentioned defects of current fan duct.

SUMMARY OF THE INVENTION

Accordingly, an objective of the present invention is to provide a fan duct which can be securely and conveniently mounted in an enclosure of a computer.

To fulfill the above mentioned objective, according to one embodiment of the present invention, a fan duct for dissipating heat generated by a central processing unit of a computer consists of a cubodial hollow main body having an air inlet and an air outlet. An electrical fan is mounted on the main body below the air outlet. A knob is attached to a top wall of the main body and located just above the fan. An enclosure of the computer has a back panel and a top cover. The back panel defines an opening. An inside of the top cover is attached with a hook. The fan duct is firstly mounted to the back panel by extending five screws through the back panel to threadedly engage with the main body. Thereafter, the top cover is mounted to the back panel to reach an assembled position wherein the knob engage with the hook whereby a portion of a weight of the electrical fan is supported by the hook.

DETAILED DESCRIPTION OF THE PREFERRED EMBODIMENT

Reference will now be made in detail to the preferred embodiments of the present invention.

Figure 1:
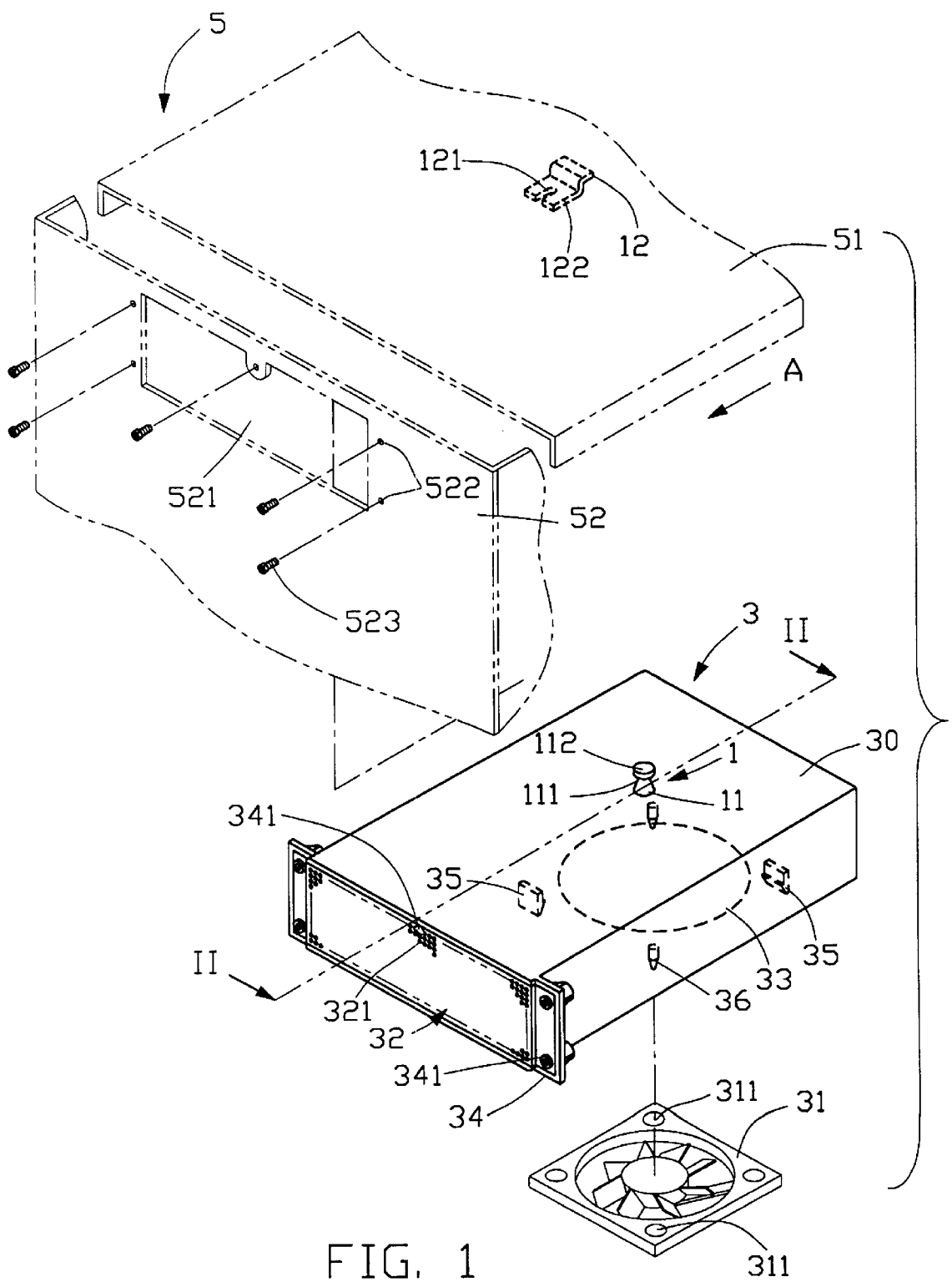
FIG. 1 is an exploded view showing a fan duct in accordance with a first embodiment of the present invention, and a portion of an enclosure of a computer.
Figure 2:
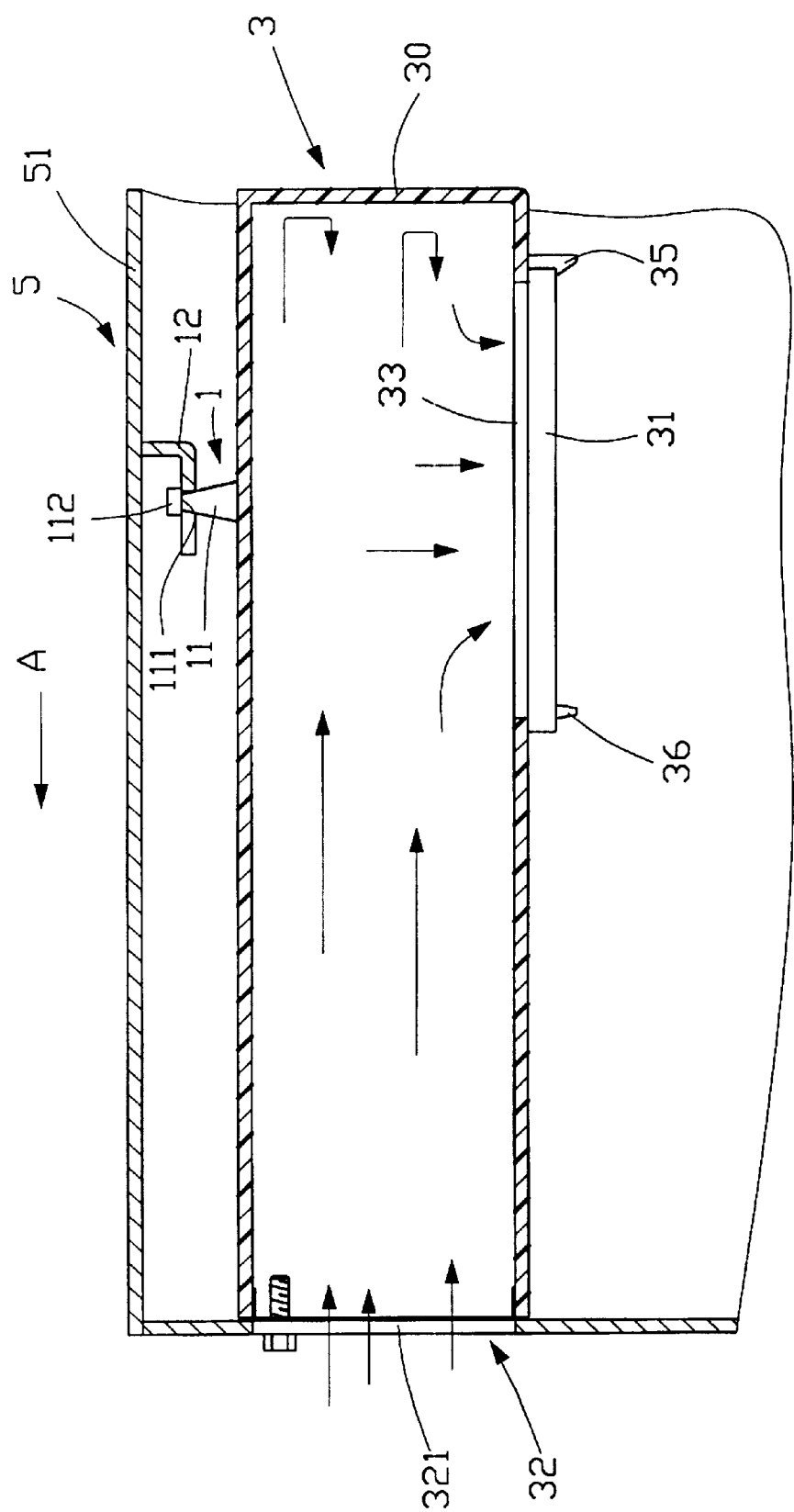
FIG. 2 is a cross-sectional view showing an assembly of the fan duct and enclosure of FIG. 1.

Referring to FIGS. 1 and 2, a fan duct 3 in accordance with a first embodiment of the present invention is shown which, like the conventional one, has a hollow, elongated main body 30 and an electrical fan 31. The main body 30 is formed by plastic injection molding. The main body 30 has a bottom wall defining an air outlet 33, and a side wall having a number of pinholes 321 functioning as an air inlet 32. Mounting posts 34 with screw holes 341 are set at four corners and a middle, upper portion of the side wall. The mounting posts 34 are used for mounting the main body 30 on a back panel 52 of an enclosure 5 of a computer by extending five screws 523 through holes 522 of the back panel 52 to threadedly engage with the screw holes 341. The fan 31 is mounted on the bottom wall of the main body 30 below the outlet 33. Two studs 36 and two brackets 35 project from the bottom wall of the main body 30. When the fan 31 is mounted to the bottom wall, the studs 36 extend through two holes 311 in a frame of the fan 31 and have an interferential fit therewith. The brackets 35 supportively engage with a bottom face of the fan 31. The back panel 52 defines an opening 521 in alignment with the inlet 32 when the fan duct 3 is mounted in the enclosure 5. When the fan 31 is activated, as indicated by arrows of FIG. 2, cool air outside the enclosure 5 is driven to flow into the main body 30 via the inlet 32 and directed to a CPU (not shown) located just below the outlet 33.

The differences between the present invention and the prior art are in that the main body 30 of the present fan duct 3 is additionally formed with a knob 11 on a top wall thereof just above the air outlet 33. The knob 11 has a conical base 111 and an upper round plate 112. A metal hook 12 is fixedly attached to an inside of a top cover 51 of the enclosure 5. The hook 12 has an upper portion (not labeled) attached to the cover 51 by spot welding and a lower portion 122 with a central slot 121.

To assemble the fan duct 3 and the enclosure 5, firstly the fan duct 3 is fixed to the back panel 52 in a manner as mentioned above. Thereafter, the top cover 51 is brought toward the back panel 52 in a direction as indicated by "A" to reach a position wherein an upper portion of the base 111 of the knob 11 extends into the slot 121 to have the round plate 112 resting against the hook 12. Therefore, a portion of a weight of the fan 31 is supported by the hook 12. Thus, the bending moment exerted to the screws 523 can be reduced, and even after a long period of operation of the fan duct 3, the connection between the screws 523 and the mounting posts 34 will not become loosen.

Figure 3:
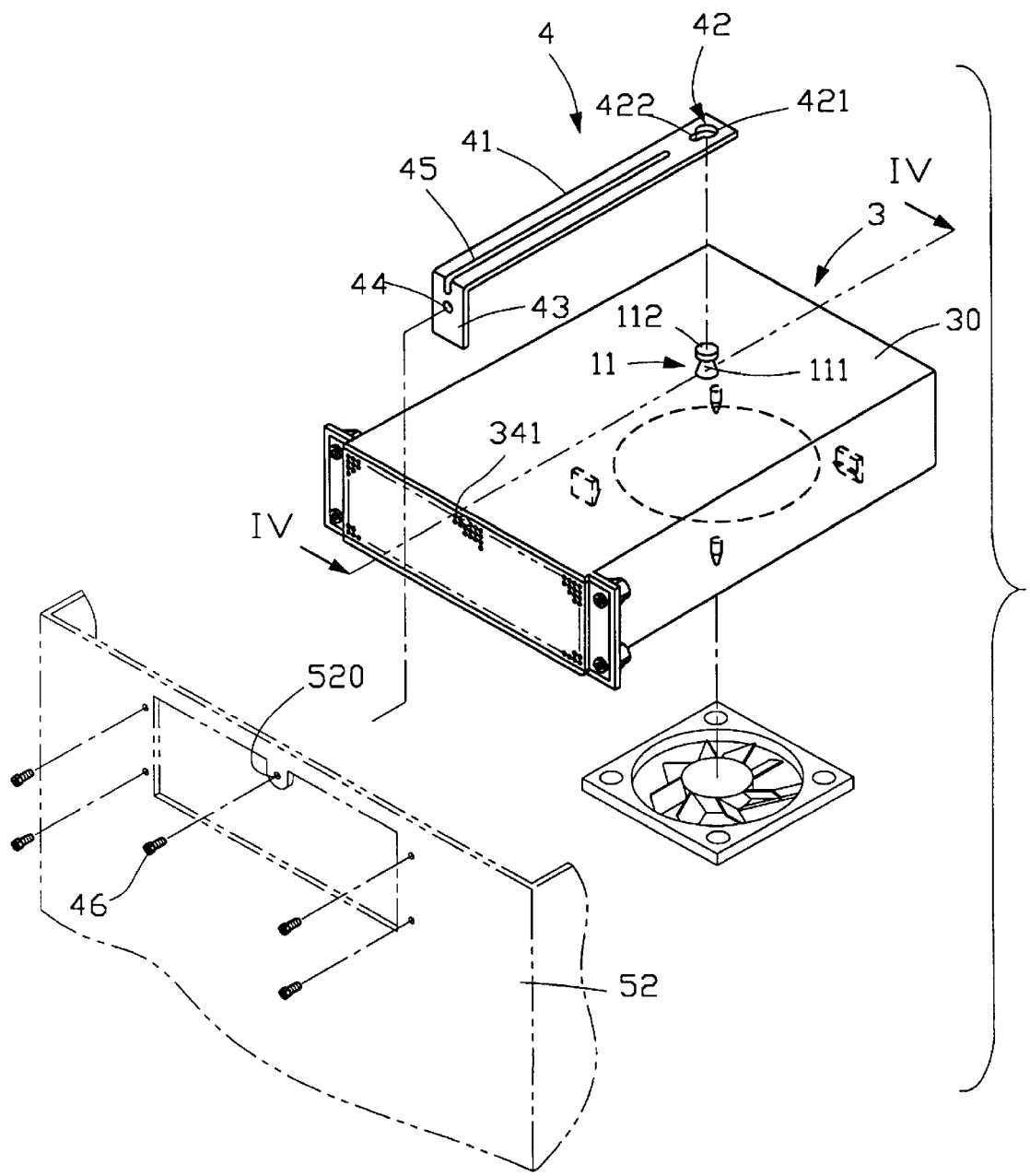
FIG. 3 is a view similar to FIG. 1, showing a fan duct in accordance with a second embodiment of the present invention, and a portion of an enclosure of a computer.
Figure 4:
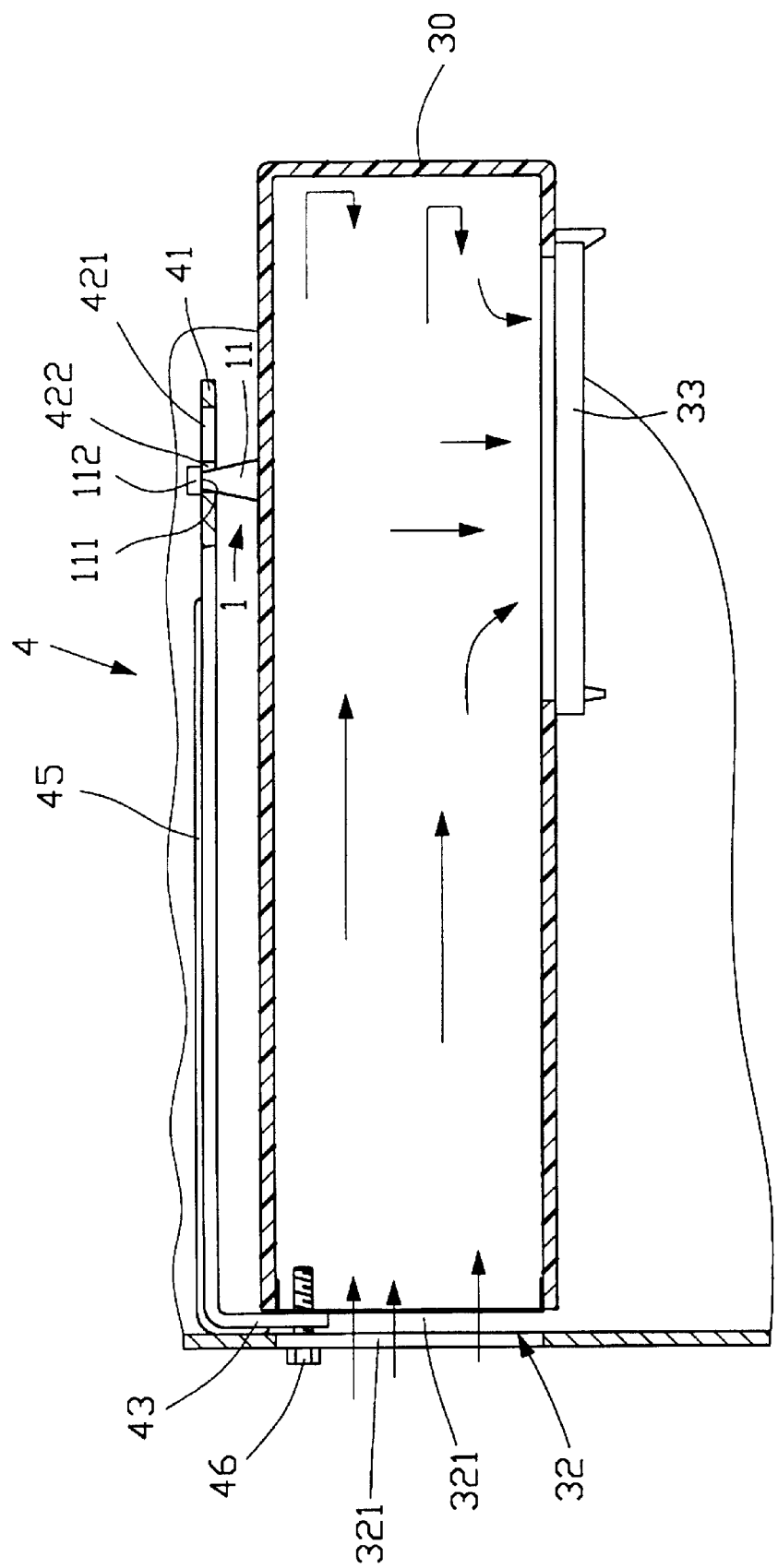
FIG. 4 is a cross-sectional view showing an assembly of the fan duct and enclosure of FIG. 3.
Figure 5:
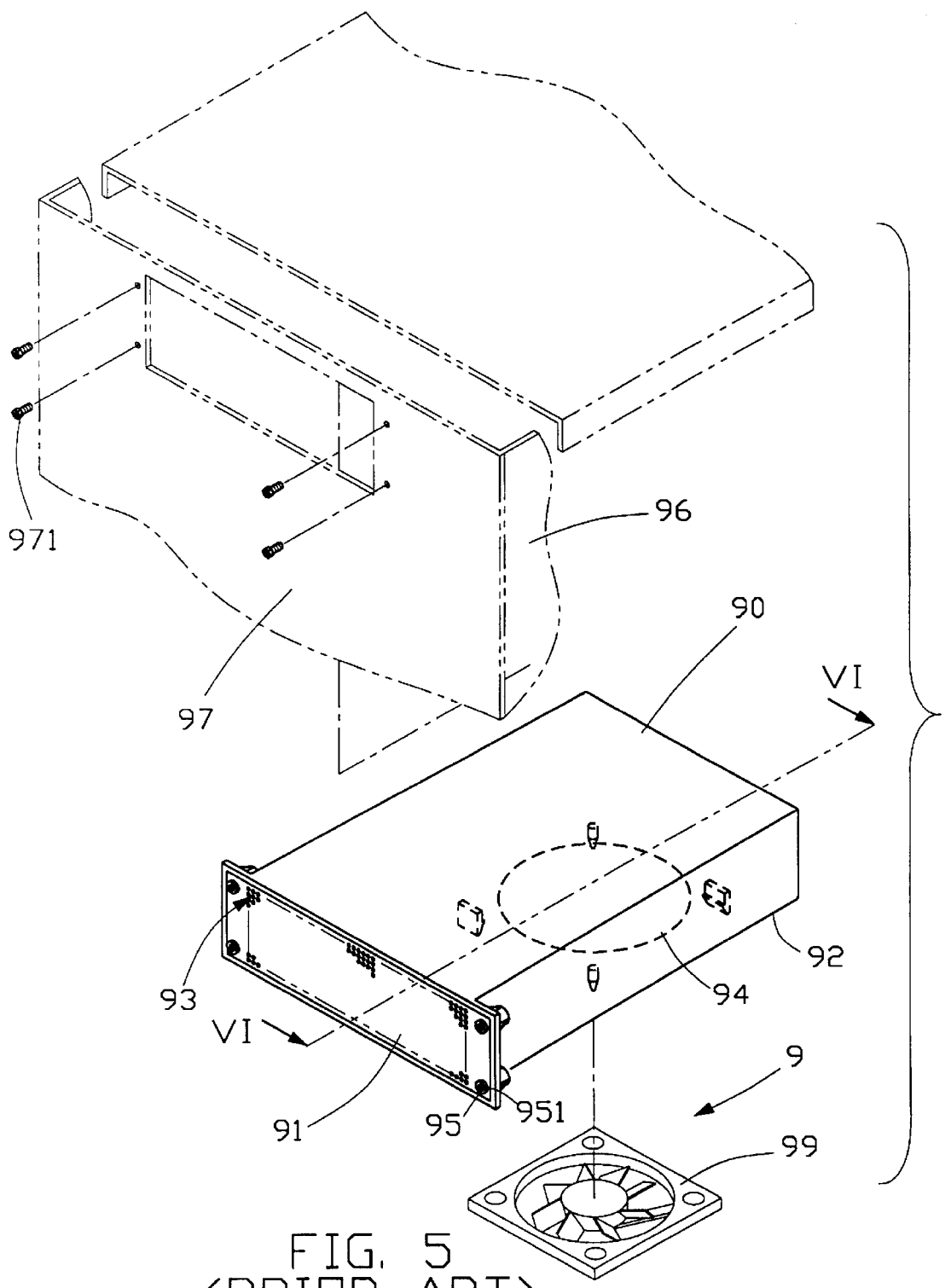
FIG. 5 is a view similar to FIG. 1, showing a fan duct in accordance with prior art and a portion of an enclosure of a computer.
Figure 6:
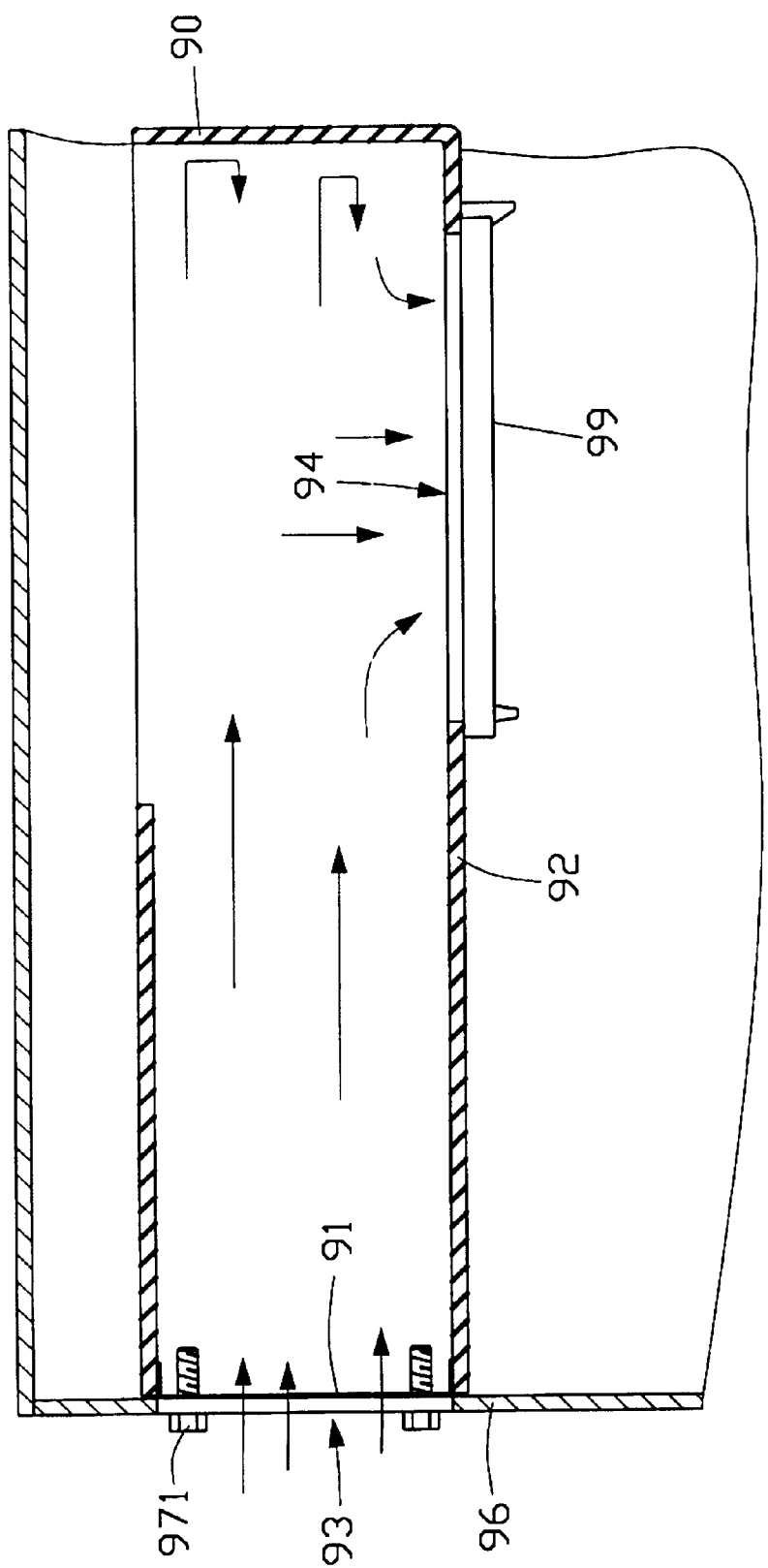
FIG. 6 is a cross-sectional view showing an assembly of the an duct and enclosure of FIG. 5.

Referring to FIGS. 3 and 4, a fan duct 3 in accordance with second embodiment of the present invention is shown. Except the following differences, the second embodiment is the same as the first embodiment.

In the second embodiment, the top cover and the hook is replaced by an L-shaped pole 4 with a long portion 41 and a short portion 43. A screw hole 44 is defined in the short portion 43. A mounting hole 42 is defined near a free end of the long portion 41. The mounting hole 42 consists of a large portion 421 having a diameter larger than that of the upper round plate 112 of the knob 11, and a small portion 422 with a diameter slightly larger than that of the upper portion of the conical base 111 of the knob 11. A reinforcing rib 45 is lengthwise formed along a middle portion of the pole 4, thereby increasing the supporting strength of the pole 4.

To assemble the fan duct 3 with the back panel 52 and the pole 4, the knob 11 is first extended through the large portion 421 of the mounting hole 42 to a position wherein the upper round plate 112 of the knob 11 is located above a top face of the pole 4. Then, the fan duct 3 is moved toward the short portion 43 of the pole 4 to reach a position wherein the upper portion of the conical base 111 of the knob 11 extend into the small portion 422 of the mounting hole 42, and the upper round plate 112 of the knob 11 rests against the pole 4. Thereafter, the pole 4 and the fan duct 3 are together mounted to the back panel 52 by extending the five screws 46 through the holes 520 in back panel 52 to threadedly engage with the screw holes 341 in the side wall of the main body 30, wherein one of the screws also threadedly engage with the screw hole 44 of the pole 4.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. A combination of a fan duct and a computer enclosure, herein the fan duct is used for dissipating heat generated by a central processing unit of a computer, comprising:
    a fan duct, comprising:
        a hollow main body having an air inlet and an air outlet;
        a knob attached to the body; and
        an electrical fan attached to the main body below the air outlet, wherein when the fan is activated, an air flow is generated to flow from the inlet to the outlet;
    a computer enclosure, comprising:
        a back panel defining an opening in alignment with the air inlet;
        screw means for fixing the back panel and the fan duct together;
        a top cover attached with a hook engaging with the knob whereby a portion of a weight of the fan is supported by the hook.

2. The combination in accordance with claim 1, wherein the knob is attached to a top wall of the main body of the fan duct and has a conical base and an upper round plate, an upper portion of the base extending into the hook to have the upper round plate resting on the hook.

3. The combination in accordance with claim 1, wherein the fan is located at a position distal from the inlet, and the knob is located just above the fan.

4. The combination in accordance with claim 1, wherein the air inlet comprises a number of pinholes.

5. The combination in accordance with claim 1, wherein the fan is attached to a bottom wall of the main body of the fan duct.

6. A fan duct mounted in a computer for dissipating heat generated by a central processing unit of the computer, comprising:
    the duct including a hollow main body defining a front surface, an air inlet in communication with an outside of the computer, and an air outlet located above the central processing unit;
    a fan mounted on the main body and in communication with the air outlet;
    fastening means on the main front surface located near the air inlet for fastening the main body to a portion of an enclosure of the computer; and
    supporting means attached to and located above the main body for supporting a portion of a weight of the fan;
    wherein the supporting means includes a pole having a first portion fastened by the fastening means, and a second portion located above the fan and main body and supportively engaging with the main body.

7. The fan duct in accordance with claim 6, wherein the second portion is a hole consisting of a large part and a small part, and the main body has a top wall attached with a knob, said knob having a conical base and an upper round plate having a size smaller than the large part of the hole, the conical base extending into the small part of the hole to engage with the pole, and the upper round plate resting against the pole.

8. The fan duct in accordance with claim 6, wherein the pole is formed with at least a reinforcing rib thereon for increasing the strength of the pole.

9. The fan duct in accordance with claim 6, wherein the supporting means includes a knob attached to a top wall of the main body and located above the fan, the knob being adapted to engage with a hook attached to a top wall of an enclosure of the computer.

* * * * *